(12) United States Patent
Kubena et al.

(10) Patent No.: US 9,991,863 B1
(45) Date of Patent: Jun. 5, 2018

(54) ROUNDED AND CURVED INTEGRATED TETHERS FOR QUARTZ RESONATORS

(71) Applicant: HRL LABORATORIES LLC, Malibu, CA (US)

(72) Inventors: Randall L. Kubena, Oak Park, CA (US); Deborah J. Kirby, Calabasas, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 522 days.

(21) Appl. No.: 14/680,902

(22) Filed: Apr. 7, 2015

Related U.S. Application Data (60) Provisional application No. 61/976,944, filed on Apr. 8, 2014.

(51) Int. Cl.
*H03H 9/19* (2006.01)
*H03H 3/007* (2006.01)
*H03H 3/02* (2006.01)

(52) U.S. Cl.
CPC ............ *H03H 3/0076* (2013.01); *H03H 9/19* (2013.01); *H03H 2003/027* (2013.01)

(58) Field of Classification Search
CPC ................................. H02N 2/18; H01L 41/113
USPC .......................................................... 310/339
See application file for complete search history.

(56) References Cited

U.S. PATENT DOCUMENTS

| | | |
|---|---|---|
| 392,650 A | 11/1888 | Watrous |
| 2,487,165 A | 11/1949 | Miller |
| 3,390,287 A | 6/1968 | Sonderegger |
| 3,766,616 A | 10/1973 | Staudte |
| 4,364,016 A | 12/1982 | Tanski |
| 4,426,769 A | 1/1984 | Grabbe |
| 4,442,574 A | 4/1984 | Wanuga |
| 4,447,753 A | 5/1984 | Ochiai |
| 4,618,262 A | 10/1986 | Maydan |
| 4,870,313 A | 9/1989 | Hirama et al. |
| 4,898,031 A | 2/1990 | Oikawa et al. |
| 4,944,836 A | 7/1990 | Beyer et al. |
| 5,203,208 A | 4/1993 | Bernstein |
| 5,226,321 A | 7/1993 | Varnham |
| 5,260,596 A | 11/1993 | Dunn et al. |
| 5,421,312 A | 6/1995 | Dawson |
| 5,480,747 A | 1/1996 | Vasudev |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

From U.S. Appl. No. 14/628,182 (unpublished, non publication requested), Office Action dated Jun. 29, 2016.

(Continued)

*Primary Examiner* — J. San Martin (74) *Attorney, Agent, or Firm* — Ladas & Parry (57) ABSTRACT

A piezoelectric quartz shear-mode resonator includes plasma etched quartz tethers, each including a mount. The tethers are for mounting the resonator to a semiconductor substrate for the purpose of isolating the thermally-induced stress from the mounts from the active resonating region, wherein the quartz tethers have rounded corners.

12 Claims, 7 Drawing Sheets

(56) References Cited

U.S. PATENT DOCUMENTS

| | | |
|---|---|---|
| 5,530,408 A | 6/1996 | Vig et al. |
| 5,552,016 A | 9/1996 | Ghanayem |
| 5,578,976 A | 11/1996 | Yao et al. |
| 5,589,724 A | 12/1996 | Satoh et al. |
| 5,604,312 A | 2/1997 | Lutz |
| 5,605,490 A | 2/1997 | Laffey et al. |
| 5,644,139 A | 7/1997 | Allen |
| 5,646,346 A | 7/1997 | Okada |
| 5,648,849 A | 7/1997 | Canteloup |
| 5,658,418 A | 8/1997 | Coronel |
| 5,665,915 A | 9/1997 | Kobayashi |
| 5,666,706 A | 9/1997 | Tomita et al. |
| 5,668,057 A | 9/1997 | Eda et al. |
| 5,728,936 A | 3/1998 | Lutz |
| 5,783,749 A | 7/1998 | Lee et al. |
| 5,894,090 A | 4/1999 | Tang et al. |
| 5,905,202 A | 5/1999 | Kubena et al. |
| 5,920,012 A | 7/1999 | Pinson |
| 5,928,532 A | 7/1999 | Koshimizu |
| 5,942,445 A | 8/1999 | Kato et al. |
| 5,959,206 A | 9/1999 | Ryrko |
| 5,981,392 A | 11/1999 | Oishi |
| 5,987,985 A | 11/1999 | Okada |
| 6,009,751 A | 1/2000 | Ljung |
| 6,044,705 A | 4/2000 | Neukermans |
| 6,049,702 A | 4/2000 | Tham et al. |
| 6,081,334 A | 6/2000 | Grimbergen |
| 6,089,088 A | 7/2000 | Charvet |
| 6,094,985 A | 8/2000 | Kapels et al. |
| 6,114,801 A | 9/2000 | Tanaka et al. |
| 6,145,380 A | 11/2000 | MacGugan |
| 6,151,964 A | 11/2000 | Nakajima |
| 6,155,115 A | 12/2000 | Ljung |
| 6,164,134 A | 12/2000 | Cargille |
| 6,182,352 B1 | 2/2001 | Deschenes |
| 6,196,059 B1 | 3/2001 | Koesslinger |
| 6,204,737 B1 | 3/2001 | Ella |
| 6,207,008 B1 | 3/2001 | Kijima |
| 6,236,145 B1 | 5/2001 | Biernacki |
| 6,250,157 B1 | 6/2001 | Touge |
| 6,263,552 B1 | 7/2001 | Takeuchi |
| 6,282,958 B1 | 9/2001 | Fell et al. |
| 6,289,733 B1 | 9/2001 | Challoner |
| 6,297,064 B1 | 10/2001 | Koshimizu |
| 6,349,597 B1 | 2/2002 | Folkmer |
| 6,367,326 B1 | 4/2002 | Okada |
| 6,367,786 B1 | 4/2002 | Gutierrez |
| 6,413,682 B1 | 7/2002 | Shibano |
| 6,417,925 B1 | 7/2002 | Naya |
| 6,424,418 B2 | 7/2002 | Kawabata |
| 6,426,296 B1 | 7/2002 | Okojie |
| 6,429,652 B1 | 8/2002 | Allen |
| 6,432,824 B2 | 8/2002 | Yanagisawa |
| 6,481,284 B2 | 11/2002 | Geen et al. |
| 6,481,285 B1 | 11/2002 | Shkel et al. |
| 6,492,195 B2 | 12/2002 | Nakanishi |
| 6,513,380 B2 | 2/2003 | Reeds et al. |
| 6,514,767 B1 | 2/2003 | Natan |
| 6,515,278 B2 | 2/2003 | Wine et al. |
| 6,571,629 B1 | 6/2003 | Kipp |
| 6,584,845 B1 | 7/2003 | Gutierrez |
| 6,614,529 B1 | 9/2003 | Tang |
| 6,621,158 B2 | 9/2003 | Martin et al. |
| 6,627,067 B1 | 9/2003 | Branton |
| 6,628,177 B2 | 9/2003 | Clark et al. |
| 6,629,460 B2 | 10/2003 | Challoner |
| 6,651,027 B2 | 11/2003 | McCall |
| 6,686,807 B1 | 2/2004 | Giousouf |
| 6,710,681 B2 | 3/2004 | Figueredo |
| 6,713,938 B2 | 3/2004 | Nguyen |
| 6,715,352 B2 | 4/2004 | Tracy |
| 6,744,335 B2 | 6/2004 | Ryhanen |
| 6,750,728 B2 | 6/2004 | Takahashi |
| 6,756,304 B1 | 6/2004 | Robert |
| 6,768,396 B2 | 7/2004 | Klee et al. |
| 6,796,179 B2 | 9/2004 | Bae et al. |
| 6,806,557 B2 | 10/2004 | Ding |
| 6,815,228 B2 | 11/2004 | Usui et al. |
| 6,856,217 B1 | 2/2005 | Clark et al. |
| 6,862,398 B2 | 3/2005 | Elkind et al. |
| 6,883,374 B2 | 4/2005 | Fell et al. |
| 6,909,221 B2 | 6/2005 | Ayazi et al. |
| 6,915,215 B2 | 7/2005 | M'Closkey |
| 6,933,164 B2 | 8/2005 | Kubena |
| 6,943,484 B2 | 9/2005 | Clark et al. |
| 6,944,931 B2 | 9/2005 | Shcheglov |
| 6,954,020 B2 | 10/2005 | Ma et al. |
| 6,985,051 B2 | 1/2006 | Nguyen et al. |
| 7,040,163 B2 | 5/2006 | Shcheglov |
| 7,057,331 B2 | 6/2006 | Shimodaira |
| 7,118,657 B2 | 10/2006 | Golovchenko |
| 7,152,290 B2 | 12/2006 | Junhua et al. |
| 7,168,318 B2 | 1/2007 | Challoner |
| 7,211,933 B2 | 5/2007 | Kawakubo |
| 7,224,245 B2 | 5/2007 | Song et al. |
| 7,232,700 B1 | 6/2007 | Kubena |
| 7,234,214 B2 | 6/2007 | Xu |
| 7,237,315 B2 | 7/2007 | Kubena |
| 7,295,088 B2 | 11/2007 | Nguyen |
| 7,317,354 B2 | 1/2008 | Lee |
| 7,347,095 B2 | 3/2008 | Shcheglov |
| 7,401,397 B2 | 7/2008 | Shcheglov |
| 7,409,851 B2 | 8/2008 | Ilic et al. |
| 7,446,628 B2 | 11/2008 | Morris, III |
| 7,459,099 B2 | 12/2008 | Kubena et al. |
| 7,459,992 B2 | 12/2008 | Matsuda |
| 7,479,846 B2 | 1/2009 | Inoue et al. |
| 7,490,390 B2 | 2/2009 | Kawakubo |
| 7,493,814 B2 | 2/2009 | Whelan et al. |
| 7,543,496 B2 | 6/2009 | Ayazi |
| 7,551,054 B2 | 6/2009 | Mizuno et al. |
| 7,555,824 B2 | 7/2009 | Chang |
| 7,555,938 B2 | 7/2009 | Bargatin et al. |
| 7,557,493 B2 | 7/2009 | Fujimoto |
| 7,559,130 B2 | 7/2009 | Kubena et al. |
| 7,564,177 B2 | 7/2009 | Yoshimatsu |
| 7,579,748 B2 | 8/2009 | Kuroda |
| 7,579,926 B2 | 8/2009 | Jhung |
| 7,581,443 B2 | 9/2009 | Kubena |
| 7,624,494 B2 | 12/2009 | Challoner |
| 7,663,196 B2 | 2/2010 | Liu et al. |
| 7,671,427 B2 | 3/2010 | Kim et al. |
| 7,675,224 B2 | 3/2010 | Tanaya |
| 7,690,095 B2 | 4/2010 | Takahashi |
| 7,750,535 B2 | 7/2010 | Kubena |
| 7,757,393 B2 | 7/2010 | Ayazi et al. |
| 7,791,431 B2 | 9/2010 | Han |
| 7,791,432 B2 | 9/2010 | Piazza et al. |
| 7,793,541 B2 | 9/2010 | Challoner |
| 7,802,356 B1 | 9/2010 | Chang |
| 7,830,074 B2 | 11/2010 | Kubena |
| 7,836,765 B2 | 11/2010 | Challoner |
| 7,872,548 B2 | 1/2011 | Nishihara |
| 7,884,930 B2 | 2/2011 | Kirby |
| 7,895,892 B2 | 3/2011 | Aigner |
| 7,958,781 B2 | 6/2011 | Fell |
| 7,987,714 B2 | 8/2011 | DeNatale |
| 7,994,877 B1 | 8/2011 | Kubena |
| 8,138,016 B2 | 3/2012 | Chang |
| 8,151,640 B1 | 4/2012 | Kubena |
| 8,176,607 B1 | 5/2012 | Kubena |
| 8,205,495 B2 | 6/2012 | Challoner |
| 8,322,028 B2 | 12/2012 | Ge et al. |
| 8,381,590 B2 | 2/2013 | Ikeda et al. |
| 8,393,212 B2 | 3/2013 | Ge et al. |
| 8,402,824 B1 | 3/2013 | Kubena |
| 8,522,612 B1 | 9/2013 | Kubena |
| 8,593,037 B1 | 11/2013 | Kubena |
| 8,766,745 B1 | 7/2014 | Kubena |
| 8,769,802 B1 | 7/2014 | Chang |
| 8,782,876 B1 | 7/2014 | Kubena |
| 8,912,711 B1 | 12/2014 | Chang |
| 9,046,541 B1 | 6/2015 | Kubena |
| 9,061,886 B1* | 6/2015 | Nguyen ............... B81B 3/0021 |

(56) References Cited

U.S. PATENT DOCUMENTS

| | | | |
|---|---|---|---|
| 9,654,082 B2* | 5/2017 | Yamada | H03H 9/19 |
| 2002/0066317 A1 | 6/2002 | Lin | |
| 2002/0072246 A1 | 6/2002 | Goo et al. | |
| 2002/0074947 A1 | 6/2002 | Tsukamoto | |
| 2002/0107658 A1 | 8/2002 | McCall | |
| 2002/0185611 A1 | 12/2002 | Menapace | |
| 2003/0003608 A1 | 1/2003 | Arikado | |
| 2003/0010123 A1 | 1/2003 | Malvern | |
| 2003/0029238 A1 | 2/2003 | Challoner | |
| 2003/0196490 A1 | 10/2003 | Cardarelli | |
| 2003/0205948 A1 | 11/2003 | Lin et al. | |
| 2004/0055380 A1 | 3/2004 | Shcheglov | |
| 2004/0055381 A1 | 3/2004 | Shcheglov | |
| 2004/0065864 A1 | 4/2004 | Vogt et al. | |
| 2004/0189311 A1 | 9/2004 | Glezer | |
| 2004/0211052 A1 | 10/2004 | Kubena et al. | |
| 2005/0024165 A1 | 2/2005 | Hsu | |
| 2005/0034822 A1 | 2/2005 | Kim et al. | |
| 2005/0056917 A1 | 3/2005 | Kwon | |
| 2005/0062368 A1 | 3/2005 | Hirasawa | |
| 2005/0093659 A1 | 5/2005 | Larson et al. | |
| 2005/0156309 A1 | 7/2005 | Fujii | |
| 2005/0172714 A1 | 8/2005 | Challoner | |
| 2005/0260792 A1 | 11/2005 | Patel | |
| 2005/0274183 A1 | 12/2005 | Shcheglov | |
| 2006/0016065 A1 | 1/2006 | Nagaura | |
| 2006/0022556 A1 | 2/2006 | Bail et al. | |
| 2006/0055479 A1 | 3/2006 | Okazaki | |
| 2006/0066419 A1 | 3/2006 | Iwaki | |
| 2006/0162146 A1 | 7/2006 | Shcheglov | |
| 2006/0197619 A1 | 9/2006 | Oishi et al. | |
| 2006/0213266 A1 | 9/2006 | French | |
| 2006/0252906 A1 | 11/2006 | Godschalx | |
| 2006/0255691 A1 | 11/2006 | Kuroda | |
| 2007/0017287 A1 | 1/2007 | Kubena | |
| 2007/0034005 A1 | 2/2007 | Acar | |
| 2007/0069605 A1 | 3/2007 | Klaasse et al. | |
| 2007/0084042 A1 | 4/2007 | Challoner | |
| 2007/0205839 A1 | 9/2007 | Kubena et al. | |
| 2007/0220971 A1 | 9/2007 | Ayazi | |
| 2007/0240508 A1 | 10/2007 | Watson | |
| 2008/0034575 A1 | 2/2008 | Chang et al. | |
| 2008/0074661 A1 | 3/2008 | Zhang et al. | |
| 2008/0096313 A1 | 4/2008 | Patel | |
| 2008/0148846 A1 | 6/2008 | Whelan | |
| 2008/0295622 A1 | 12/2008 | Challoner | |
| 2009/0095077 A1 | 4/2009 | DeNatale | |
| 2009/0140356 A1 | 6/2009 | Yazdi | |
| 2009/0146527 A1 | 6/2009 | Lee et al. | |
| 2009/0189294 A1 | 7/2009 | Chang | |
| 2010/0020311 A1 | 1/2010 | Kirby | |
| 2010/0024560 A1 | 2/2010 | Shcheglov | |
| 2010/0148803 A1 | 6/2010 | Ohnishi | |
| 2010/0251817 A1 | 10/2010 | Ge et al. | |
| 2010/0251818 A1 | 10/2010 | Ge et al. | |
| 2011/0107838 A1 | 5/2011 | Suijlen | |
| 2012/0000288 A1 | 1/2012 | Matsuura | |
| 2012/0212109 A1 | 8/2012 | Yamazaki | |
| 2012/0266682 A1 | 10/2012 | Torashima | |

FOREIGN PATENT DOCUMENTS

| | | |
|---|---|---|
| EP | 0 461 761 | 12/1991 |
| EP | 0 531 985 | 3/1993 |
| EP | 1055908 | 11/2000 |
| EP | 0 971 208 | 12/2000 |
| JP | 57-091017 | 6/1982 |
| JP | 401129517 | 5/1989 |
| JP | 04322507 | 11/1992 |
| JP | 5286142 | 11/1993 |
| JP | 06232678 | 8/1994 |
| JP | 6-318533 | 11/1994 |
| JP | 08330878 | 12/1996 |
| JP | 9-247025 | 9/1997 |
| JP | 2003-318685 | 11/2003 |
| JP | 2005-180921 | 7/2005 |
| JP | 2006-352487 | 12/2006 |
| KR | 10-2001-0110428 | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

From U.S. Appl. No. 14/628,182 (unpublished, non publication requested), Office Action dated Dec. 9, 2016.

U.S. Appl. No. 14/628,182, filed Feb. 20, 2015, Nguyen.

U.S. Appl. No. 13/363,174, filed Jan. 31, 2012, Kubena.

U.S. Appl. No. 12/179,579, filed Jul. 24, 2008, Kubena.

U.S. Appl. No. 12/026,486, filed Feb. 5, 2008, Kubena.

Aaltonen, T. et al., "ALD of Rhodium thin films from Rh (acac) 3 and Oxygen" Electrochemical and Solid State Letters, 8, C99-101 ( 2005).

Abe, T., et al., "One-chip Multichannel Quartz Crystal Microbalance (QCM) Fabricated by Deep RIE," Sensors and Actuators, 82 (2000), pp. 139-143.

Antonio, D. et al., "Micromechanical magnetometer using an all-silicon nonlinear torsional resonator," Applied Physics Letters 95, 133505 2009 (4 pages).

Bahreyni, Behraad, et al.,"A Resonant Micromachined Magnetic Field Sensor," IEEE Sensors Journal, vol. 7, No. 9, Sep. 2007, pp. 1326 to 1334.

Barbour et al., "Micromechanical Silicon Instrument and Systems Development at Draper Laboratory," AIAA Guidance Navigation and Control Conference, 1996, Paper No. 96-3709.

Burdess et al., "The Theory of a Piezoelectric Disc Gyroscope", Jul. 1986, IEEE Transactions and Aerospace abd Electronic Systems, vol. AES 22, No. 4; p. 410-418.

Cleland, A.N. et al., "Fabrication of High Frequency Nanometer Scale Mechanical Resonators From Bulk Si Crystals," Applied Physics Letters, Oct. 28, 1996, pp. 2653-2655.

Evoy, S., et al. "Temperature-dependent Internal Friction in Silicon Nanoelectromechanical Systems," Applied Physics Letters, vol. 77, No. 15, Oct. 9, 2000, pp. 2397-2399.

Friedt, J-M., et al., "Introduction to the quartz tuning fork", American Journal of Physics 75, 415 (2007), pp. 415-422.

Fujita et al., "Disk-shaped bulk micromachined gyroscope with vacuum sealing," Sensors and Actuators 82, May 2000, pp. 198-204.

Greer, J.A., et al., "Properties of SAW resonators fabricated on quartz substrates of various qualities" Ultrasonics Symposium, 1994 IEEE, vol. 1, Nov. 1-4, 1994, pp. 31-36.

Herrera-May, A L, et al."A resonant magnetic field microsensor with high quality factor at atmospheric pressure," J. Micromechanics Microengineering, 19 (2009) 015016 (11pp).

Johnson et al., "Surface Micromachined Angular Rate Sensor," 1995 SAE Conference, Paper No. 950538, pp. 77-83.

Lin, J.W., et al., "A Robust High-Q Micromachined RF Inductor for RFIC Applications," IEEE Transactions on Electronic Devices, vol. 52, No. 7, pp. 1489-1496 (Jul. 2005).

Nguyen, Hung D., et al., "UHF Piezoelectric Quartz MEMS Magnetometers Based on Acoustic Coupling of Flexural and Thickness Shear Modes," MEMS 2015, Estoril, Portugal, Jan. 18-22, 2015, pp. 944-947.

Park, K.J. et al., "Selective area atomic layer deposition of rhodium and effective work function characterization in capacitor structures," Applied Physics Letters 89, 043111 (2006), 3 pages.

Putty et al., "A Micromachined Vibrating Ring Gyroscope," Solid State Sensor and Actuator Workshop, Transducer Research Foundation, Hilton Head, South Carolina, 1994, pp. 213-220.

(56) References Cited

OTHER PUBLICATIONS

Sirbuly, Donald J. et al., Multifunctional Nanowire Evanescent Wave Optical Sensors, Advanced Materials, 2007 (published online: Dec. 5, 2006), 19, pp. 61-66.
Skulski et al., "Planar resonator sensor for moisture measurements", Microwaves and Radar, 1998, MIKON '98, 12th International Conf., vol. 3, May 20-22, 1998, pp. 692-695.
Sunier, R., et al., "Resonant Magnetic Field Sensor With Frequency Output," Journal of Microelectromechanical Systems, vol. 15, No. 5, pp. 1098-1107, Oct. 2006.
Tang et al., "A Packaged Silicon MEMS Vibratory Gyroscope for Microspacecraft," Proceedings IEEE, 10th Annual Int. Workshop on MEMS, Japan, 1997, pp. 500-505.
Tang et al., "Silicon Bulk Micromachined Vibratory Gyroscope," Jet Propulsion Lab, Jun. 2, 1996 (6 pages).
Thompson, M.J. "Low Power 3-axis Lorentz Force Navigation Magnetometer,", MEMS 2011, Cancun, Mexico, Jan. 23-27, 2011.
White, Lan M., et al., Increasing the Enhancement of SERS with Dielectric Microsphere Resonators, Spectroscopy-Eugene, Apr. 2006 (5 pages).
Wickenden, Dennis, et al. "Development of Miniature Magnetometers," Johns Hopkins APL Technical Digest, vol. 18, No. 2 (1997), pp. 271-278.
Wright, et al., "The HRG Applied to a Satellite Attitude Reference System," Guidance and Control, AASAAS, 1994, 86: pp. 55-67.
Yan, Fei, et al., "Surface-enhanced Raman scattering (SERS) detection for chemical and biological agents," IEEE Sensors Journal, vol. 5, No. 4, Aug. 2005 (7 pages).
From U.S. Appl. No. 14/628,182, (filed Feb. 20, 2015, unpublished, non publication requested), Application and Office Actions.
From U.S. Appl. No. 12/026,486, (filed Feb. 5, 2008, unpublished, non publication requested), Application and Office Actions.
From U.S. Appl. No. 11/818,797 (now published as 2010/0020311), Application and Office Actions.
From U.S. Appl. No. 12/179,579 (unpublished, non publication requested), Office Action dated Dec. 9, 2010.
From U.S. Appl. No. 13/363,174 (unpublished, non publication requested), Office Action dated Aug. 27, 2014.
From U.S. Appl. No. 13/363,174 (unpublished, non publication requested), Office Action dated Jun. 13, 2014.
From U.S. Appl. No. 10/426,931 (now published as U.S. Pat. No. 7,237,315), Notice of Allowance dated Feb. 1, 2007.
From U.S. Appl. No. 10/426,931 (now published as U.S. Pat. No. 7,237,315), Office Action dated Oct. 24, 2006.
From U.S. Appl. No. 10/426,931 (now published as U.S. Pat. No. 7,237,315), Office Action dated Sep. 13, 2006.
From U.S. Appl. No. 10/426,931 (now published as U.S. Pat. No. 7,237,315), Office Action dated Jul. 11, 2006.
From U.S. Appl. No. 10/426,931 (now published as U.S. Pat. No. 7,237,315), Office Action dated Jan. 20, 2006.
From U.S. Appl. No. 10/426,931 (now published as U.S. Pat. No. 7,237,315), Office Action dated Aug. 11, 2005.
From U.S. Appl. No. 10/426,931 (now published as U.S. Pat. No. 7,237,315), Office Action dated May 16, 2005.
From U.S. Appl. No. 10/426,931 (now published as U.S. Pat. No. 7,237,315), Office Action dated Dec. 8, 2004.
From U.S. Appl. No. 10/426,931 (now published as U.S. Pat. No. 7,237,315), Office Action dated Aug. 31, 2004.
From U.S. Appl. No. 10/426,931 (now published as U.S. Pat. No. 7,237,315), Office Action dated Jun. 16, 2004.
From U.S. Appl. No. 11/043,378 (now published as U.S. Pat. No. 7,459,099), Notice of Allowance dated Aug. 4, 2008.
From U.S. Appl. No. 11/043,378 (now published as U.S. Pat. No. 7,459,099), Office Action dated Jan. 15, 2008.
From U.S. Appl. No. 11/043,378 (now published as U.S. Pat. No. 7,459,099), Office Action dated Sep. 12, 2007.
From U.S. Appl. No. 11/043,378 (now published as U.S. Pat. No. 7,459,099), Office Action dated May 25, 2007.
From U.S. Appl. No. 11/043,378 (now published as U.S. Pat. No. 7,459,099), Office Action dated Dec. 6, 2006.
From U.S. Appl. No. 11/043,378 (now published as U.S. Pat. No. 7,459,099), Office Action dated Aug. 11, 2006.
From U.S. Appl. No. 11/458,911 (now published as U.S. Pat. No. 7,581,443), Notice of Allowance dated Apr. 23, 2009.
From U.S. Appl. No. 11/458,911 (now published as U.S. Pat. No. 7,581,443), Office Action dated Sep. 17, 2008.
From U.S. Appl. No. 11/458,911 (now published as U.S. Pat. No. 7,581,443), Office Action dated Jul. 2, 2008.
From U.S. Appl. No. 11/458,911 (now published as U.S. Pat. No. 7,581,443), Office Action dated Apr. 17, 2008.
From U.S. Appl. No. 11/458,911 (now published as U.S. Pat. No. 7,581,443), Office Action dated Oct. 12, 2007.
From U.S. Appl. No. 11/502,336 (now published as U.S. Pat. No. 7,555,824), Notice of Allowance dated Mar. 20, 2009.
From U.S. Appl. No. 11/502,336 (now published as U.S. Pat. No. 7,555,824), Office Action dated Jan. 23, 2009.
From U.S. Appl. No. 11/502,336 (now published as U.S. Pat. No. 7,555,824), Office Action dated Nov. 14, 2008.
From U.S. Appl. No. 11/800,289 (now published as U.S. Pat. No. 7,559,130), Notice of Allowance dated Mar. 25, 2009.
From U.S. Appl. No. 11/800,289 (now published as U.S. Pat. No. 7,559,130), Office Action dated Oct. 24, 2008.
From U.S. Appl. No. 11/800,294 (now published as U.S. Pat. No. 7,750,535), Notice of Allowance dated Nov. 30, 2009.
From U.S. Appl. No. 11/800,294 (now published as U.S. Pat. No. 7,750,535), Office Action dated Jul. 29, 2009.
From U.S. Appl. No. 11/881,461 (now published as U.S. Pat. No. 7,830,074), Notice of Allowance dated Sep. 24, 2010.
From U.S. Appl. No. 11/881,461 (now published as U.S. Pat. No. 7,830,074), Notice of Allowance dated Jul. 13, 2010.
From U.S. Appl. No. 11/881,461 (now published as U.S. Pat. No. 7,830,074), Office Action dated Jun. 2, 2010.
From U.S. Appl. No. 11/881,461 (now published as U.S. Pat. No. 7,830,074), Office Action dated Oct. 19, 2009.
From U.S. Appl. No. 11/881,461 (now published as U.S. Pat. No. 7,830,074), Office Action dated Jun. 16, 2009.
From U.S. Appl. No. 12/027,247 (now published as U.S. Pat. No. 8,151,640), Office Action dated Dec. 8, 2011.
From U.S. Appl. No. 12/027,247 (now published as U.S. Pat. No. 8,151,640), Office Action dated Jun. 7, 2011.
From U.S. Appl. No. 12/027,247 (now published as U.S. Pat. No. 8,151,640), Office Action dated Feb. 16, 2011.
From U.S. Appl. No. 12/034,852 (now published as U.S. Pat. No. 7,802,356), Notice of Allowance dated May 19, 2010.
From U.S. Appl. No. 12/034,852 (now published as U.S. Pat. No. 7,802,356), Office Action dated Jan. 28, 2010.
From U.S. Appl. No. 12/034,852 (now published as U.S. Pat. No. 7,802,356), Office Action dated Oct. 2, 2009.
From U.S. Appl. No. 12/145,678 (now published as U.S. Pat. No. 7,884,930), Notice of Allowance dated Jul. 13, 2010.
From U.S. Appl. No. 12/145,678 (now published as U.S. Pat. No. 7,884,930), Office Action dated Mar. 26, 2010.
From U.S. Appl. No. 12/145,678 (now published as U.S. Pat. No. 7,884,930), Office Action dated Jan. 14, 2010.
From U.S. Appl. No. 12/145,678 (now published as U.S. Pat. No. 7,884,930), Office Action dated Jul. 22, 2009.
From U.S. Appl. No. 12/268,309 (now published as U.S. Pat. No. 7,994,877), Notice of Allowance dated Apr. 4, 2011.
From U.S. Appl. No. 12/268,309 (now published as U.S. Pat. No. 7,994,877), Office Action dated Nov. 22, 2010.
From U.S. Appl. No. 12/268,309 (now published as U.S. Pat. No. 7,994,877), Office Action dated Aug. 20, 2010.
From U.S. Appl. No. 12/399,680 (now published as U.S. Pat. No. 8,138,016), Notice of Allowance dated Nov. 14, 2011.
From U.S. Appl. No. 12/399,680 (now published as U.S. Pat. No. 8,138,016), Office Action dated Aug. 4, 2011.
From U.S. Appl. No. 12/399,680 (now published as U.S. Pat. No. 8,138,016), Office Action dated Jun. 7, 2011.
From U.S. Appl. No. 12/488,784 (now published as U.S. Pat. No. 8,766,745), Notice of Allowance dated Feb. 20, 2014.
From U.S. Appl. No. 12/488,784 (now published as U.S. Pat. No. 8,766,745), Office Action dated Oct. 3, 2013.

(56) References Cited

OTHER PUBLICATIONS

From U.S. Appl. No. 12/488,784 (now published as U.S. Pat. No. 8,766,745), Office Action dated Jun. 4, 2013.
From U.S. Appl. No. 12/488,784 (now published as U.S. Pat. No. 8,766,745), Office Action dated Jan. 3, 2013.
From U.S. Appl. No. 12/488,784 (now published as U.S. Pat. No. 8,766,745), Office Action dated Aug. 1, 2012.
From U.S. Appl. No. 12/488,784 (now published as U.S. Pat. No. 8,766,745), Office Action dated Apr. 30, 2012.
From U.S. Appl. No. 12/575,634 (now published as U.S. Pat. No. 8,176,607), Notice of Allowance dated Jan. 9, 2012.
From U.S. Appl. No. 12/575,634 (now published as U.S. Pat. No. 8,176,607), Office Action dated Oct. 17, 2011.
From U.S. Appl. No. 12/575,634 (now published as U.S. Pat. No. 8,176,607), Office Action dated Jul. 11, 2011.
From U.S. Appl. No. 12/575,634 (now published as U.S. Pat. No. 8,176,607), Office Action dated Mar. 23, 2011.
From U.S. Appl. No. 12/820,761 (now published as U.S. Pat. No. 8,912,711), Notice of Allowance dated Oct. 30, 2014.
From U.S. Appl. No. 12/820,761 (now published as U.S. Pat. No. 8,912,711), Notice of Allowance dated Aug. 15, 2014.
From U.S. Appl. No. 12/820,761 (now published as U.S. Pat. No. 8,912,711), Office Action dated Jul. 1, 2014.
From U.S. Appl. No. 12/820,761 (now published as U.S. Pat. No. 8,912,711), Office Action dated Mar. 7, 2014.
From U.S. Appl. No. 12/820,761 (now published as U.S. Pat. No. 8,912,711), Office Action dated Nov. 19, 2013.
From U.S. Appl. No. 12/820,761 (now published as U.S. Pat. No. 8,912,711), Office Action dated Jul. 24, 2013.
From U.S. Appl. No. 12/820,761 (now published as U.S. Pat. No. 8,912,711), Office Action dated Mar. 19, 2013.
From U.S. Appl. No. 12/820,761 (now published as U.S. Pat. No. 8,912,711), Office Action dated Nov. 2, 2012.
From U.S. Appl. No. 12/820,761 (now published as U.S. Pat. No. 8,912,711), Office Action dated Sep. 6, 2012.
From U.S. Appl. No. 12/820,761 (now published as U.S. Pat. No. 8,912,711), Office Action dated Jun. 25, 2012.
From U.S. Appl. No. 12/820,761 (now published as U.S. Pat. No. 8,912,711), Office Action dated Feb. 23, 2012.
From U.S. Appl. No. 12/820,761 (now published as U.S. Pat. No. 8,912,711), Office Action dated Jan. 9, 2012.
From U.S. Appl. No. 12/831,028 (now published as U.S. Pat. No. 8,769,802), Notice of Allowance dated Feb. 27, 2014.
From U.S. Appl. No. 12/831,028 (now published as U.S. Pat. No. 8,769,802), Office Action dated Nov. 7, 2013.
From U.S. Appl. No. 12/831,028 (now published as U.S. Pat. No. 8,769,802), Office Action dated Apr. 11, 2012.
From U.S. Appl. No. 13/163,357 (now published as U.S. Pat. No. 8,782,876), Notice of Allowance dated Mar. 13, 2014.
From U.S. Appl. No. 13/163,357 (now published as U.S. Pat. No. 8,782,876), Office Action dated Aug. 19, 2013.
From U.S. Appl. No. 13/163,357 (now published as U.S. Pat. No. 8,782,876), Office Action dated Mar. 1, 2013.
From U.S. Appl. No. 13/410,998 (now published as U.S. Pat. No. 8,522,612), Notice of Allowance dated Apr. 11, 2013.
From U.S. Appl. No. 13/434,144 (now published as U.S. Pat. No. 8,593,037), Office Action dated Jul. 11, 2013.
From U.S. Appl. No. 13/648,041 (now published as U.S. Pat. No. 9,046,541), Notice of Allowance dated Jan. 16, 2015.
From U.S. Appl. No. 13/648,041 (now published as U.S. Pat. No. 9,046,541), Office Action dated Sep. 15, 2014.
From U.S. Appl. No. 13/840,160 (now published as U.S. Pat. No. 9,061,886), Notice of Allowance dated Feb. 20, 2015.
From U.S. Appl. No. 13/840,160 (now published as U.S. Pat. No. 9,061,886), Office Action dated Dec. 16, 2014.
From U.S. Appl. No. 13/840,160 (now published as U.S. Pat. No. 9,061,886), Office Action dated Jun. 30, 2014.
From U.S. Appl. No. 14/628,182 (unpublished, non publication requested), Final Office Action dated Nov. 9, 2017.

* cited by examiner

ROUNDED AND CURVED INTEGRATED TETHERS FOR QUARTZ RESONATORS

CROSS-REFERENCE TO RELATED APPLICATIONS

The present application claims priority from provisional application 61/976,944, filed Apr. 8, 2014, and titled "Tethers for Quartz Resonators" the disclosure of which is incorporated by reference herein.

STATEMENT REGARDING FEDERALLY SPONSORED RESEARCH OR DEVELOPMENT

This invention was made with Government support under Contract No. withheld/N66001--13--C--4020 Co--Integration of High--Aspect--Ratio Si Gyros & Quartz Clocks for Improved Inertial Performance. The Government has certain rights in the invention.

BACKGROUND OF THE INVENTION

Field of the Invention

The present invention relates to mounting microelectromechanical system (MEMS) components on a substrate, and in particular to tethers for reducing stress on the MEMS component and increasing fabrication yield.

Discussion of the Related Art

Because characteristics of nearly all electronic components vary with temperature, to maintain accuracy it is desirable for them to operate in an environment in which the temperature is kept substantially constant. Placing a controlled heater element near other components (resonators, gyroscopes, etc.) in a system or subsystem to maintain a substantially constant temperature is termed ovenization. An ovenization approach has been used for improving the performance of inertial MEMS devices using a frequency locking technique with two resonators with different f/T (frequency/temperature) characteristics. This technique has been shown to substantially improve the bias and turn-on to turn-on stability of gyroscopes. The accuracy of the ovenization technique is improved by minimizing thermal gradients and thermal time constants between the two resonators. Placing the components of the system or subsystem in a common housing minimizes thermal gradients. Placing a controlled heating element within the housing further aids in maintaining a substantially constant temperature further minimizing thermal gradients.

Mounting MEMS components on a substrate is a technique for encapsulating on a single chip a variety of different components providing different functionality. This may be done by bonding these components to a single semiconductor substrate. Some components, such as resonators and gyroscopes, are sensitive to strain during operation, and the presence of strain can make readings from that component inaccurate. Strain may be caused by stress induced during the bonding process to semiconductor substrates. This can also create breaks and cracks at sharp corners in quartz. In addition, strain may be caused by stress induced during operation by vibration, attitude changes, acceleration, and temperature gradients.

More specifically, for quartz resonators bonded to Si substrates, the differential thermal expansion between the quartz and the Si substrate can produce stress in the quartz which leads to strain. Strain in the quartz, in turn, changes the elastic constants, density and dimensions of the quartz plate. These changes can affect the frequency versus temperature characteristics of the quartz resonator. For commercial quartz resonators, the quartz is bonded with a compliant conductive epoxy within a ceramic package. The epoxy reduces the stress propagation into the quartz. However, for metallic solder bonding to Si substrates, other methods are needed to prevent the strain in the active region from modifying the expected f/T (frequency versus temperature) profiles.

For devices that require some form of stress isolation from the mounts for thermal stability, integrated tethers offer a solution. That is, to minimize strain during fabrication and operation, sensitive components may be mounted to the substrate using one or more tethers which can substantially dissipate strain before it can affect the component. High manufacturing yield for integrated tether designs is also critical.

One technique for minimizing stress, and thus undesirable strain, uses a folded spring tether design. However, a conventional folded spring design can suffer from low yield in the manufacturing process. In addition, some conventional tether designs can allow extraneous shearing modes to develop which can propagate in the plane of the resonator and create active electrical resonances at lower frequencies than the main thickness shear mode. In addition, some conventional folded spring designs can lead to extraneous in-plane modes that can interfere with the operation of the oscillator.

A tether design that can minimize transmission of stress from a substrate to a MEMS component, while reducing or minimizing inducing extraneous in-plane modes and increasing fabrication yields is desirable.

BRIEF SUMMARY OF THE INVENTION

The inventors have discovered that using bonding temperatures above room temperature can create stress over a 3" wafer stack consisting of a quartz handle wafer and a Si substrate such that quartz tethers can break at sharp corners near the bond sites. Typically, as many as 50% of the devices across a wafer can be affected. This is an experimental observation that is difficult to predict through simulations. The inventors have also discovered that by rounding the corners this cracking near high stress regions can be reduced.

They have also learned that straight folded tether designs can lead to extraneous active modes developing at lower frequencies than the usual in-plane shear mode. In some cases, these modes can have a reasonable high Q and can compete with the main mode within an oscillator circuit. By curving and varying the width of the tethers along their length, these extraneous modes can be suppressed.

The inventors have realized that unless the corners are rounded, folded spring tethers can crack during the bonding process due to differential expansion between the base wafer and the handle wafer on which the resonators are mounted. In addition, quasi-circular tethers can be used to eliminate extraneous in-plane modes. Finally, circular symmetric designs allow the integration of a quartz resonator with other larger circular symmetric devices such as gyros for miniaturization and tight environmental coupling. These tethers can be singly clamped or doubly clamped designs to minimize vibration sensitivity while maintaining low stress over temperature in the active regions. Unless the integrated tethers have rounded corners, are curved, or in some cases varied in width along their length, low yield and extraneous modes can result. In addition, for applications which require the smallest footprint possible, the use of tether designs that wrap conformally around the resonator allow compact integration and packaging.

In accordance with principles of the present invention a piezoelectric quartz shear-mode resonator includes plasma etched quartz tethers, each comprising a mount, for mounting the resonator to a semiconductor substrate for the purpose of isolating the thermally-induced stress from the mounts from the active resonating region wherein the quartz tethers have rounded corners.

Using a resonator design in accordance with principles of the present invention, quartz and Si gyro resonators can be integrated with a very small footprint that is no larger than a gyroscope itself. This produces a small and rigid package for e.g. air and ground vehicle navigation systems. By using doubly clamped rounded and curved tethers, the phase noise vibration sensitivity can also be reduced in high-g environments.

In one embodiment, the proposed quartz resonator is designed to be integrated on a Si substrate with rounded and curved, quasi-circular, or circularly symmetric integrated quartz tethers. By curving and widening the tethers along their length dimension, extraneous modes can be minimized or eliminated. Finally, by wrapping the tethers in a circular or quasi-circular fashion around the resonator, the overall footprint of the resonator can be reduced while minimizing high stress points which can crack the tethers during fabrication.

BRIEF DESCRIPTION OF THE DRAWINGS

FIG. 10 is a diagram of a circular resonator in which FIG. 10A is a side view and FIG. 10B is a plan view of a circular SC-cut 75-MHz resonator with tethers to isolate the stress from the mounts from the active region, in accordance with principles of the present invention;

DETAILED DESCRIPTION OF THE INVENTION

Figure 1:
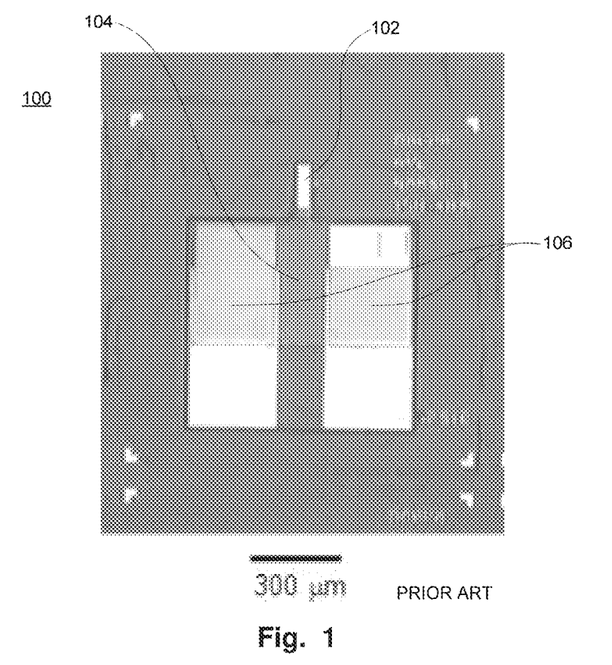
FIG. 1 is a plan diagram of a MEMs-based quartz resonator without tethers between bond pads and the resonator.

Quartz MEMS resonators can be integrated to semiconductor substrates using wafer-level processes in a known manner. FIG. 1 is a plan diagram of a MEMs-based quartz resonator without tethers between bond pads and the resonator. In FIG. 1, a substrate 100 has a quartz plate 104 bonded to it and a quartz resonator 102 is fabricated from the quartz plate 104. Bond pads 106 are used to bond the resonator 102 to corresponding pads on the substrate.

The bond of the quartz plate 104 to the semiconductor substrate 100 is typically produced using a Au/In eutectic bond which can be initially created at low bond temperatures (<150° C.). The metallization can then be interdiffused at a higher temperature to form a robust attachment that can withstand much higher temperature processing for vacuum packaging and die attachment processes. The Au/In is deposited at wafer level. The typical geometry of this bonding area relative to the active region of the resonator is shown in FIG. 1.

The thermal expansion coefficient of quartz is $7.8 \times 10^{-6}/°$ C. in the Z-direction and $14.3 \times 10^{-6}/°$ C. perpendicular to the Z-direction while Si has a thermal expansion coefficient of $2.5 \times 10^{-6}/°$ C. As the temperature of the resonator is increased the quartz tends to expand more than the Si to which it is mounted. The bond pads then produce a generally compressive stress on the quartz. This stress can propagate into the active region producing strain which changes the elastic constants, the dimensions, and the density. These changes then produce frequency shifts which vary as the temperature is changed resulting in apparent rotations of the f/T curves. Moreover, the high stress in the metallic bond metal can partially relax over time resulting in hysteresis in the f/T profiles. Computer simulation 3-D stress models have shown that the typical stress generated in the active regions for VHF-UHF resonator geometries similar to that shown in FIG. 1 can be 500 KPa to 1 MPa for a $\Delta T=80°$ C. These stress level can produce measureable changes in the frequency at the 10-100 part-per-million (ppm) level.

Several folded tether designs have been used in order to reduce the stress propagation from the mounts to the active regions. However, in many folded tether designs the tethers can break due to stress that develops during the heterogeneous bonding of the quartz resonators on quartz handle wafers to Si substrates and during subsequent release steps.

Figure 2:
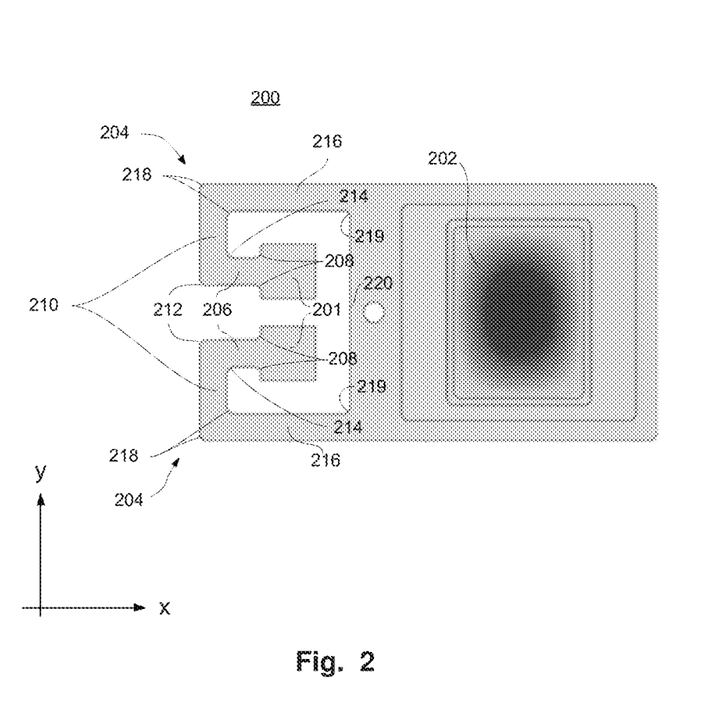
FIG. 2 is a plan diagram of a quartz resonator with isolation tethers and rounded corners for minimizing cracking of the tethers during the bonding and release steps, in accordance with principles of the present invention.

FIG. 2 is a plan diagram of a resonator assembly 200 of a quartz resonator active region 202, two mounts 201 and two corresponding isolation tethers 204. Each isolation tether 204 has three sections. In FIG. 2, the longitudinal axis of the assembly 200 is represented by the x axis and the transverse axis of the assembly 200 is represented by the y axis. Elements closer to the origin are termed proximal and elements farther from the origin are termed distal.

Respective mounts 201 are coupled to corresponding first sections 206 by rounded inner and outer corners 208. The first sections 206 are coupled through a right angle to respective second sections 210 by corresponding rounded outer corners 212 and rounded inner corners 214. The second sections 210 are coupled through a right angle to respective third sections 216 by inner and outer rounded corners 218. The third sections 216 are coupled to the resonator active region 202 by rounded inner corners 219. The respective isolation tethers 204 form a straight line 220 between the inner corners 219.

In general, rounded corners reduce and/or minimize cracking of the tethers 204 during the bonding and release steps. With rounded corners as shown in FIG. 2, this problem can be reduced and/or minimized to maintain high manufacturing yield. Also, the high stress leading to cracking is more critical on the inner corners than on the outer corners.

Narrow tethers provide a less stiff structure and therefore a higher degree of stress relief. Wider tethers are more stiff and therefore provide less stress relief through their length. Tethers that are as narrow as possible, while satisfying fabrication tolerance design rules, are preferred.

Figure 3:
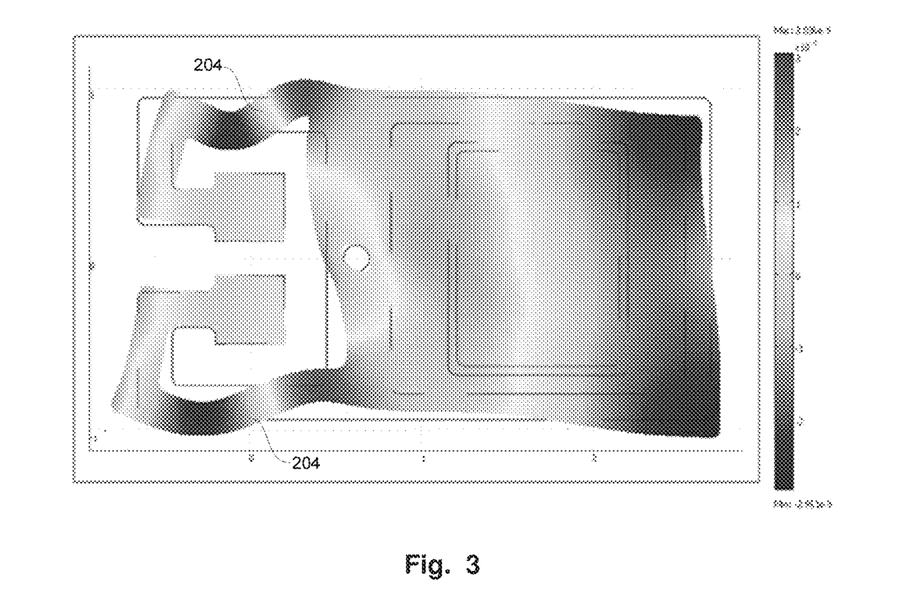
FIG. 3 is a stress diagram of a 1.6 MHz extraneous mode produced by the long straight tethers used for stress isolation.
Figure 4:
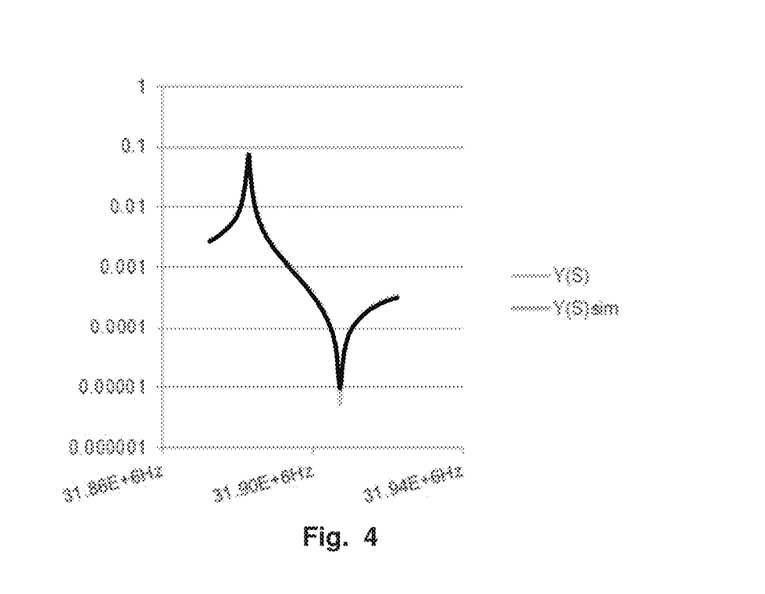
FIG. 4 is an admittance data diagram for a 32-MHz shear-mode resonator with straight-line folded tethers for stress isolation showing admittance data for the desired shear-mode resonance.
Figure 5:
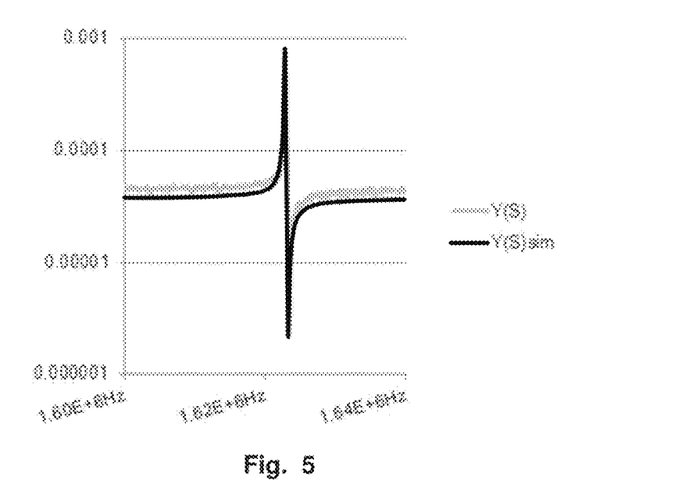
FIG. 5 is an admittance data diagram showing admittance data for the extraneous mode shown in FIG. 3.

FIG. 4 is an exemplary admittance data diagram for a 32-MHz shear-mode resonator with straight-line folded tethers for stress isolation as illustrated in FIG. 2 showing admittance data for the desired shear-mode resonance. The measured values for the resonator equivalent circuit producing the admittance data diagram of FIG. 4 are:

$R_1$=12.4 Ω,
$C_1$=5.53×10$^{-15}$ F,
$L_1$=3.76×10$^{-3}$ H,
$C_0$=4.3×10$^{-12}$ F and
Q=61 k FIG. 3 is a stress diagram of a 1.6 MHz extraneous mode produced by the long straight tethers used for stress isolation, as illustrated in FIG. 2. Straight folded spring segments can allow extraneous modes to develop which are electrically active and can compete with the main high Q shear mode, as described above. An example of this type of mode is shown in FIG. 3. FIG. 5 is an admittance data diagram showing admittance data for the extraneous mode shown in FIG. 3. The measured values for the resonator equivalent circuit producing the admittance data diagram of FIG. 5 are:

$R_1$=1289 Ω,
$C_1$=2.33×10$^{-15}$ F,
$L_1$=4.1 H,
$C_0$=3.65×10$^{-12}$ F and
Q=33 k The electrical admittance of this extraneous mode is compared to the fundamental shear mode in FIG. 4 and FIG. 5.

Figure 6:
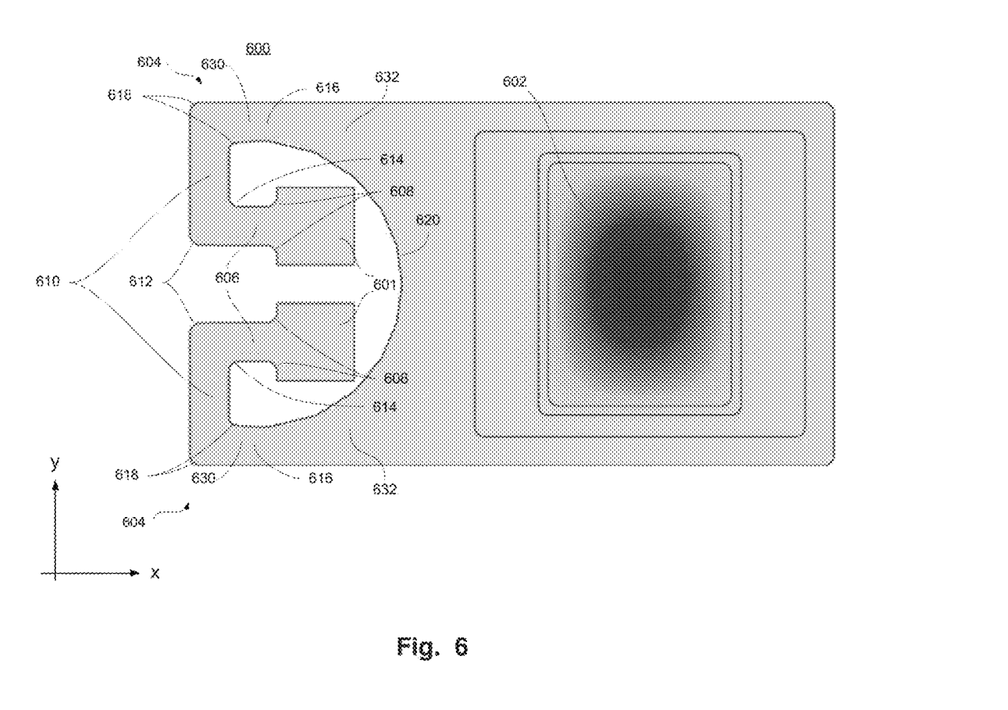
FIG. 6 is a plan diagram of a quartz resonator with isolation tethers which have rounded corners and which the width of the tether is varied along its length for minimizing extraneous modes, in accordance with principles of the present invention.

FIG. 6 is a plan diagram of a resonator assembly 600 including a quartz resonator active region 602, mounts 601 and isolation tethers 604. In FIG. 6, the longitudinal axis of the assembly 600 is represented by the x axis and the transverse axis of the assembly 600 is represented by the y axis. Elements closer to the origin are termed proximal and elements farther from the origin are termed distal.

The respective mounts 601 are coupled to corresponding first sections 606 of the isolation tethers 604 by rounded inner and outer corners 608. The respective first sections are coupled through a right angle to corresponding second sections 610 by rounded outer corners 612 and rounded inner corners 614. The respective second sections are coupled through a right angle to corresponding third sections 616 by rounded inner and outer corners 618. The respective third sections 616 are coupled to the resonator active region 602. The respective isolation tethers 604 form a continuous curve, for example a semicircle, arc of an ellipse, or any similar curve, as illustrated in FIG. 6, between the respective inner corners 618 of the second sections 610. The width of the respective third sections 616 of the isolation tethers 604 is, thus, varied along its length for minimizing the amplitude of extraneous modes.

In the curved tether design of FIG. 6 the width of the tether 604 is varied along its length from a narrow section 630 to a wide section 632. The curved tether design of FIG. 6: (1) reduces cracking by reducing the stress near corners and (2) reduces the strength of extraneous flexural modes along the length of the tethers 604. The relative piezoelectric current levels between the original extraneous mode and the modes for the new design are shown in the admittance plots of FIG. 7 and FIG. 8, respectively.

Figure 7:
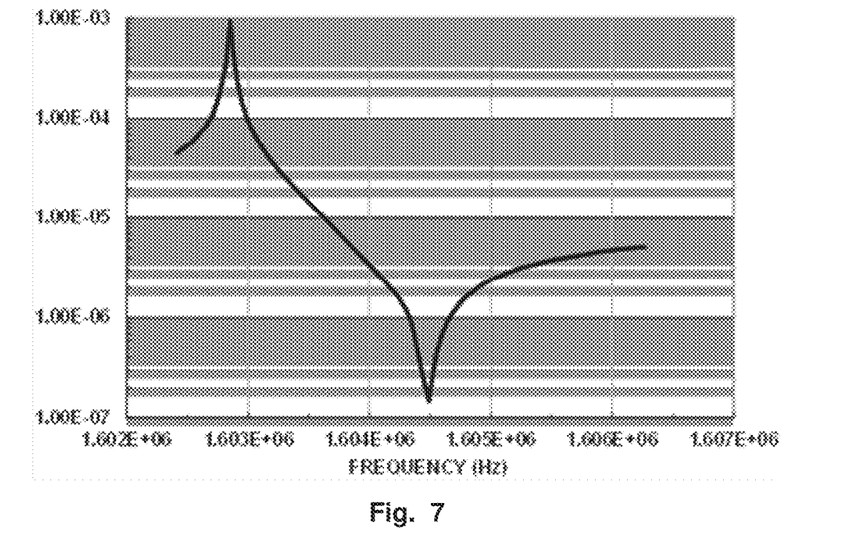
FIG. 7 and FIG. 8 are admittance simulations of 32-MHz fundamental mode resonators showing the extraneous modes below about 5 MHz with and without tethers with widths that vary along their length, respectively.
Figure 8:
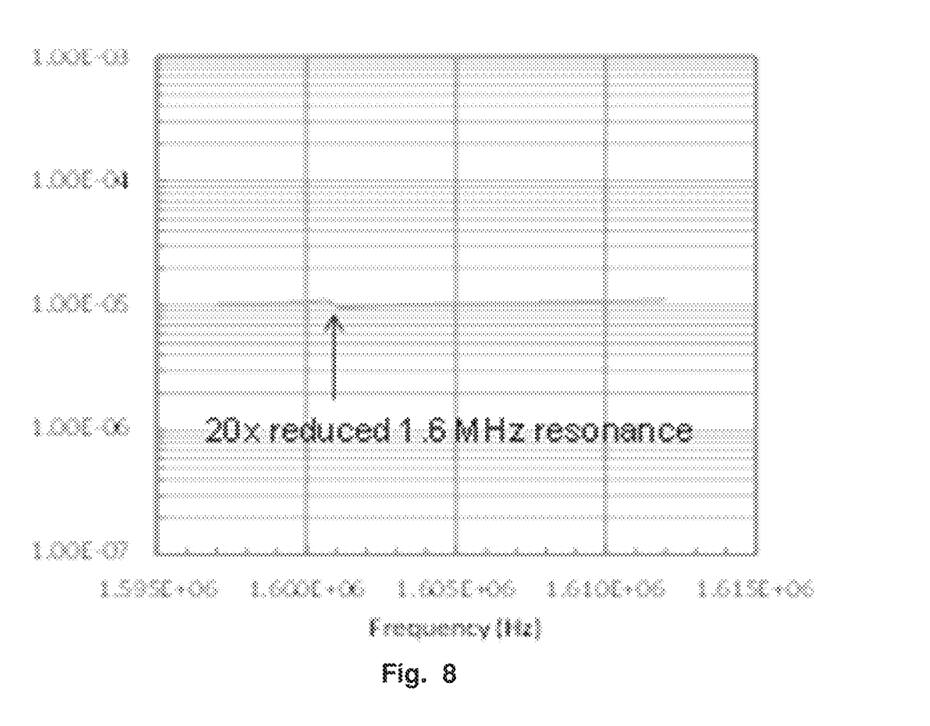

FIG. 7 and FIG. 8 are admittance simulations of extraneous modes below about 5 MHz without and with tethers with widths that vary along their length, respectively. In FIG. 7 and FIG. 8, admittance values are normalized to 1 v. FIG. 7 illustrates the admittance data related to the 1.6 MHz extraneous mode in the design of FIG. 2. FIG. 7 illustrates a pronounced resonance mode at 1.6 MHz. FIG. 8 illustrates the admittance data related to the 1.6 MHz extraneous mode in the design of FIG. 6. In FIG. 8 the quality factor (Q) of the resonance response in the design of FIG. 6 is reduced 20 times and the admittance is reduced by 100×, as noted in the figure.

Figure 9:
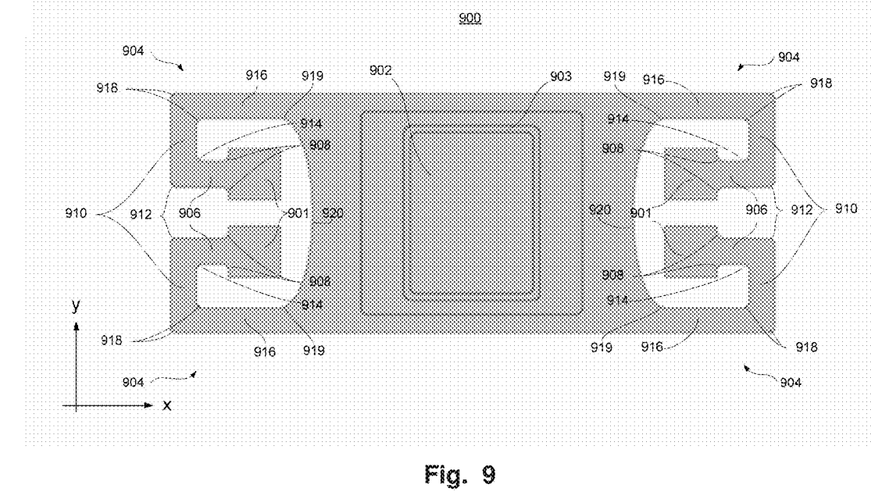
FIG. 9 is a plan diagram of a doubly clamped quartz resonator design with rounded corners for preventing cracking of the tethers during bonding and release, in accordance with principles of the present invention.

FIG. 9 is a plan diagram of a resonator assembly 900 of a doubly clamped quartz resonator design with rounded corners for preventing cracking of the tethers during bonding and release. In FIG. 9, the doubly clamped design with rounded corners also reduces strain in the resonator from vibration. In FIG. 9, the longitudinal axis of the assembly 900 is represented by the x axis and the transverse axis of the assembly 900 is represented by the y axis. Elements closer to the origin are termed proximal and elements farther from the origin are termed distal.

In FIG. 9, the resonator assembly 900 includes a resonator active region 902 fabricated on a mesa 903 and four mounts 901. Four corresponding isolation tethers 904 couple the respective mounts 901 to the resonator active region 902. Two pairs of isolation tethers 904 are fabricated, one pair proximal on the longitudinal axis of FIG. 9 and one pair distal on the longitudinal axis of FIG. 9. The respective mounts 901 are coupled to corresponding first sections 906 of the isolation tethers 904 by rounded inner and outer corners 908. The respective first sections 906 are coupled through a right angle to corresponding second sections 910 by rounded outer corners 912 and rounded inner corners 914. Respective second sections 910 are coupled to corresponding third sections 916 by rounded inner and outer corners 918. The respective third sections 916 are coupled to the resonator active region 902 by a rounded inner corner 919. The respective isolation tethers 904 at the proximal longitudinal end form a continuous curve 920 between the respective inner corners 919. Similarly, the respective isolation tethers 904 at the distal longitudinal end form a continuous curve 920 between the respective inner corners 919. The continuous curve may be semicircular, an arc of a ellipse, or other similar continuous curve. The curved isolation tethers 904 reduce or minimize stress between the mounts 901 and the resonator active region 902, and reduce cracking during fabrication, improving yield.

Comparing the resonator assembly 600 in FIG. 6 to that of 900 in FIG. 9, the continuous curve 620 formed by the isolation tethers 604 in FIG. 6 runs between the inner corners 618 of the second sections 610. In FIG. 9, the respective continuous curves 920 formed by the isolation tethers 904 run between the inner corners 919 of the third sections 916. In addition, the isolation tethers 904 of FIG. 9 have a longer third section 916 compared to the third section 616 in FIG. 6, and the third section 916 has a relatively constant width, compared to the third section 616. The degree of curvature of the isolation tethers in general determines the level of stiffness of the structure and the amount of extraneous mode extinction. One skilled in the art understands that this is a trade-off. As the curvature is more prominent, the stiffness of the structure increases and the extraneous modes amplitude decreases, however, the stress in the resonator active region increases correspondingly. Therefore, the selection of the curvature of the isolation tethers is predicated on reducing extraneous modes while not compromising the resonator performance in terms of stress in the active region.

Figure 10:
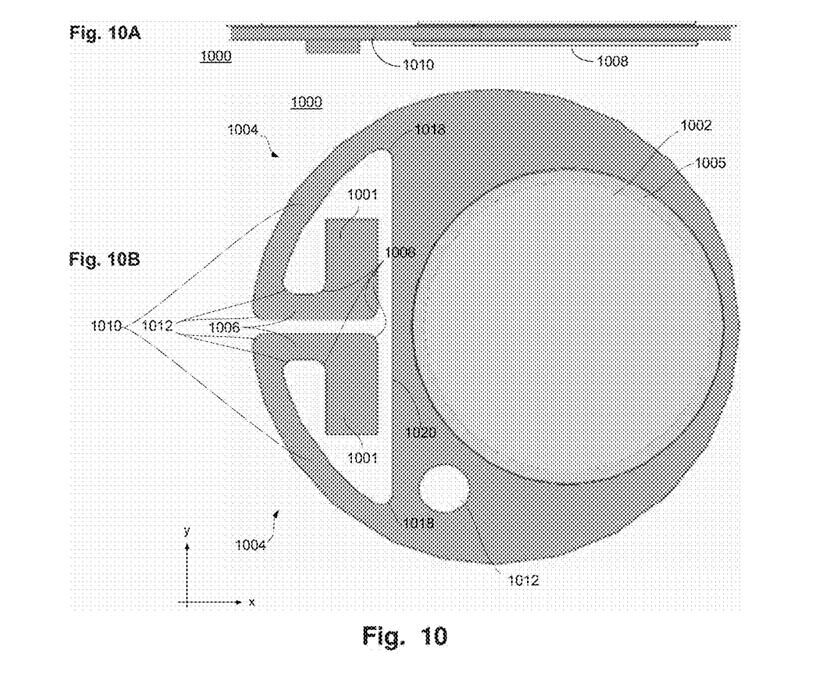

FIG. 10 is a diagram of a resonator assembly 1000, in which FIG. 10A is a side view and FIG. 10B is a plan view of a circular SC-cut 75-MHz resonator assembly 1000 with isolation tethers 1004 to isolate the stress at the mounts 1001 from the resonator active region 1002. In FIG. 10, the longitudinal axis of the assembly 1000 is represented by the x axis and the transverse axis of the assembly 1000 is represented by the y axis. Elements closer to the origin are termed proximal and elements farther from the origin are termed distal.

The assembly 1000 is fabricated from quartz and may have a diameter of 950 μm and a thickness of 19.5 μm (1010). The mounts 1001 may be 100 μm in the x-axis direction, and 200 μm in the y-axis direction of FIG. 10, and are separated by a gap of 30 μm. The resonator in the active region 1002 is fabricated on a mesa 1005 having a thickness of 22.0 μm (1008). The resonator active region 1002 is elliptical having a major axis of 580 μm, and a minor axis of 560 μm. The mesa 1005 may be fabricated to form a 25 μm margin around the resonator active region 1002. A via 1012 may have a diameter of 100 μm and may be fabricated in the assembly 1000.

The resonator assembly 1000 of FIG. 10 includes curved isolation tethers 1004 which wrap around a circular or elliptical or similarly shaped resonator to conform to the shape of the resonator, termed conformally wrapped in this application, and maintain a small circular footprint for integration with other sensors. The shape of such isolation tethers is substantially circular, termed quasi-circular in this application. The respective mounts 1001 of the isolation tethers 1004 are coupled through a right angle to corresponding first sections 1006 by rounded inner and outer corners 1008. The respective first sections 1006 are coupled to corresponding quasi-circular second sections 1010 by rounded inner and outer corners 1012. The respective second sections 1010 are substantially arcuate and substantially constant in width. In some embodiments, the second sections 1010 of the curved isolation tethers 1004 may have a transverse width of 50 μm. The respective second sections 1010 are coupled to the resonator active region 1002 by a circular inner corner 1018. Some embodiments include two sections in the respective isolation tethers 1004: one substantially straight section (e.g. 1006) and one substantially curved (e.g. 1010). A high fidelity plasma etch may be used to form the 50-μm-wide tethers and gaps in VHF shear-mode resonators where the thickness of the quartz can be of comparable dimensions.

Comparing FIG. 10B to FIG. 9, in FIG. 9, the isolation tethers 904 at the proximal end and distal end, respectively, of the transverse axis form respective continuous curves between the curved inner corners of the third sections 916.

Figure 11:
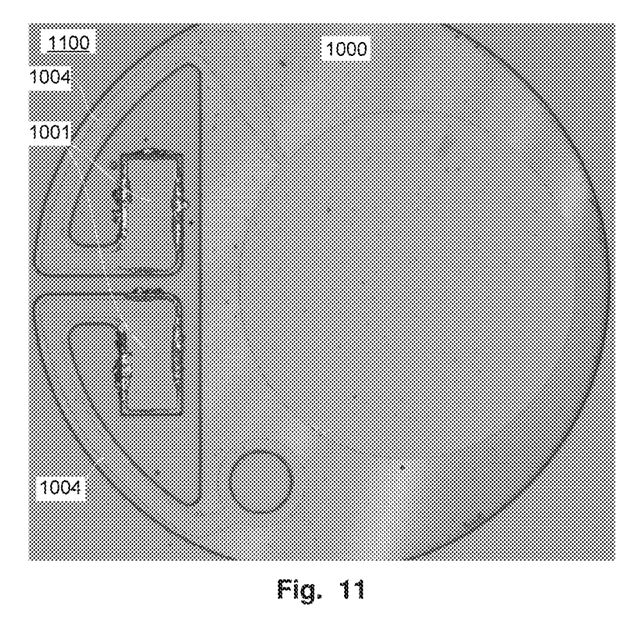
FIG. 11 is a plan diagram of a fabricated VHF quartz resonator bonded to a substrate with conformally wrapped curved tethers producing a stress isolated resonator with a compact circular footprint, in accordance with principles of the present invention.

FIG. 11 is a plan diagram of a fabricated VHF quartz resonator assembly 1000 as illustrated in FIG. 10, in which the mounts 1001 are bonded in place to a substrate 1100 with conformally wrapped curved tethers 1004 producing a stress isolated resonator with a compact circular footprint An advantage of this design is that a VHF resonator can fabricated with stress isolation and with a total footprint of only about 1-mm in diameter. Other straight folded spring designs, such as those illustrated in FIG. 2, FIG. 6 and FIG. 9, can increase the overall length of the resonator.

Figure 12:
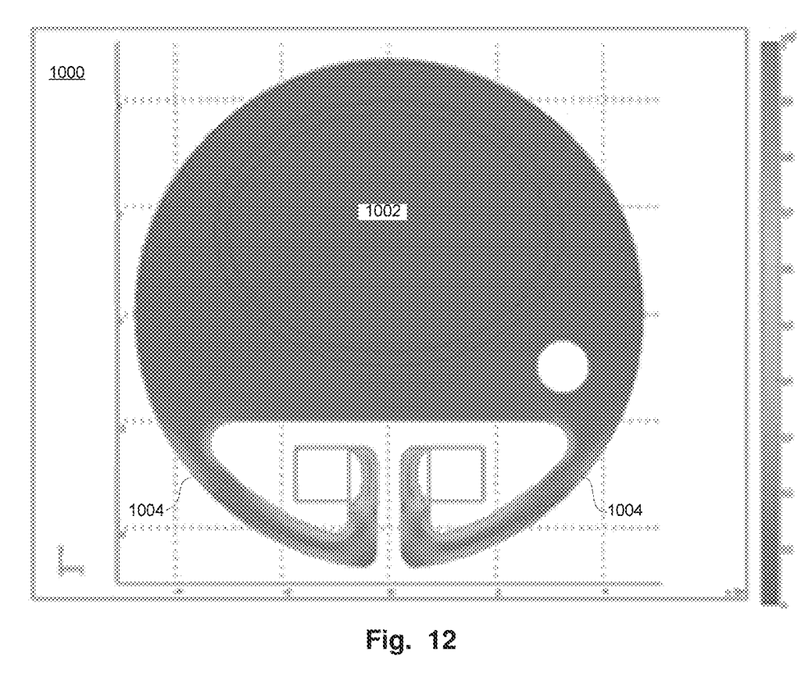
FIG. 12 and FIG. 13 are computer generated modal stress analyses of the fundamental mode using conformally wrapped curved tethers for stress isolation, high yield manufacturing (low cracking), and ultra-small overall footprint.
Figure 13:
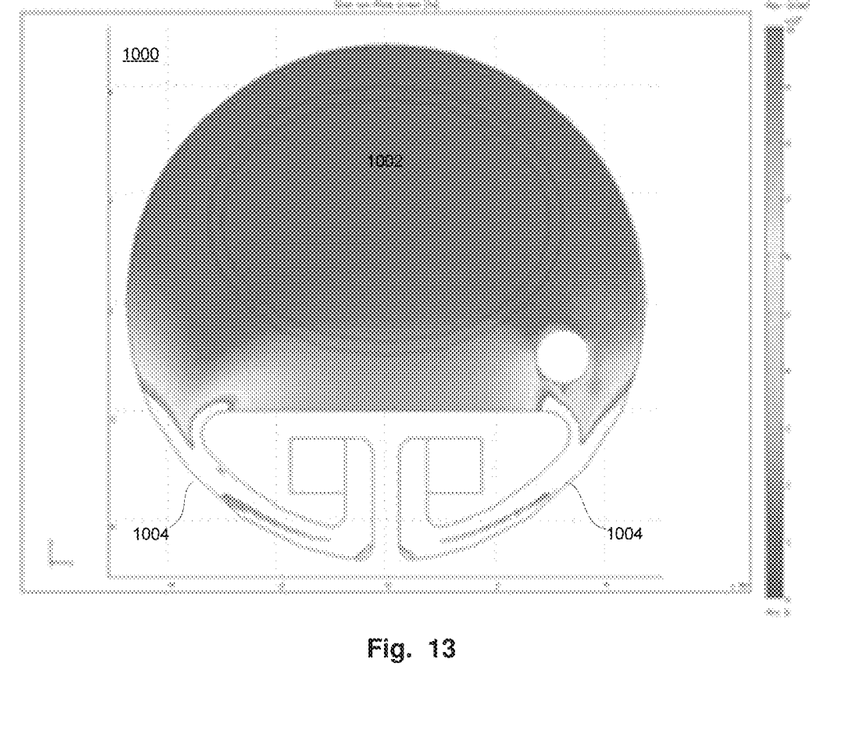

The stress isolation for the resonator assembly 1000 of FIG. 10 is shown in FIG. 12 and FIG. 13 for a room temperature (RT) to 80° C. temperature change ΔT. FIG. 12 and FIG. 13 are computer simulated von Mises stress analyses for a resonator assembly 1000 using conformally wrapped curved tethers 1004 for stress isolation, high yield manufacturing (low cracking), and ultra-small overall footprint. FIG. 12 shows stress in the range from 0 to 10 MPa, with dark regions representing areas of lower stress and lighter regions representing areas of higher stress. As illustrated in FIG. 12, stress in the active region of the resonator 1002 is relatively low, while the higher stress is attenuated in the isolation tethers 1004. FIG. 13 shows stress in the range from 0 to 1 MPa. That is, a shade of gray in FIG. 12 represents a stress level 10× the stress level represented by that same shade of gray in FIG. 13. In FIG. 13, dark regions represent lower stress and lighter regions represent higher stress. As illustrated in FIG. 13, stress in the active region of the resonator 1002 is relatively low, while some stress is present in the region just beyond the isolation tethers 1004. The isolation tethers 1004 have the highest amount of stress.

As illustrated in FIG. 12 and FIG. 13, most of the stress is attenuated in the isolation tethers, and the resulting stress at the center of the electrode is 40.3 kPa or less at an operating condition of 80° C. A satisfactory level of stress for quartz resonators may be 100 kPa stress or less. This provides a very low stress level and mitigates ppm level changes in the frequency of the resonator.

The invention claimed is:

1. A piezoelectric quartz shear-mode resonator comprising quartz isolation tethers, each comprising a mount for mounting to a semiconductor substrate, wherein the quartz tethers each have at least one rounded corner.

2. The quartz shear-mode resonator of claim 1 wherein:
the respective mounts are coupled to corresponding first sections of the isolation tethers by rounded outer corners and inner corners;
the respective first sections are coupled through a right angle to corresponding second sections by a rounded outer corner and a rounded inner corner;
the respective second sections are coupled through a right angle to corresponding third sections by rounded outer corners and inner corners; and
the respective third sections are coupled to the resonator by an rounded inner corner; wherein
the respective isolation tethers form a straight line between the inner corners of the third sections.

3. The quartz shear-mode resonator of claim 1 wherein:
the respective mounts are coupled to corresponding first sections by rounded outer corners and inner corners;
the respective first sections are coupled through a right angle to corresponding second sections by a rounded outer corner and a rounded inner corner; and
the respective second sections are coupled through a right angle to corresponding third sections by rounded outer corners and inner corners; and the respective third sections are coupled to the resonator by a rounded inner corner; wherein the respective isolation tethers form a continuous curve between the rounded outer and inner corners of the second sections.

4. The quartz shear-mode resonator of claim 1 wherein:

the respective mounts are coupled to corresponding first sections by rounded outer corners and inner corners;

the respective first sections are coupled through a right angle to corresponding second sections by a rounded outer corner and a rounded inner corner;

the respective second sections are coupled through right angles to corresponding third sections by rounded outer and inner corners;

the respective third sections are coupled to the resonator by a rounded inner corner; wherein the respective isolation tethers form a continuous curve between the inner corners of the third section.

5. The quartz shear-mode resonator of claim 1 wherein:

the resonator is round or elliptical;

the isolation tethers are conformally wrapped around the resonator, wherein:

the respective mounts are coupled through a right angle to corresponding first sections of the tethers by rounded outer corners and inner corners;

the respective first sections are coupled through substantially right angles to corresponding quasi-circular second sections by rounded outer corners and inner corners; and the respective second sections are coupled to the resonator by corresponding rounded inner corners; wherein the respective isolation tethers form a substantially straight line between the inner corners of the third section.

6. The quartz shear-mode resonator of claim 1 wherein the quartz isolation tethers are plasma etched.

7. The quartz shear-mode resonator of claim 1 wherein the quartz isolation tethers are rounded or quasi-circular.

8. The quartz shear-mode resonator of claim 1 wherein the lateral width of the quartz isolation tethers is varied along its length.

9. The quartz shear-mode resonator of claim 1 wherein two sets of rounded or quasi-circular isolation tethers are attached to opposite sides of the resonator to minimize vibrational-induced strain in the resonator.

10. The quartz shear-mode resonator of claim 1 wherein the resonator is bonded to the semiconductor substrate with a metallic solder in the mount regions.

11. The quartz shear-mode resonator of claim 1, wherein the quartz shear-mode resonator operates with its fundamental mode in the VHF or UHF ranges.

12. The quartz shear-mode resonator of claim 1 wherein the quartz is composed of AT or SC-cut material.

* * * * *